United States Patent
Kabir et al.

(10) Patent No.: US 11,430,874 B2
(45) Date of Patent: Aug. 30, 2022

(54) SEMICONDUCTOR DEVICE WITH A CROSSING REGION

(71) Applicant: NXP USA, INC., Austin, TX (US)

(72) Inventors: Humayun Kabir, Gilbert, AZ (US); Ibrahim Khalil, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/123,939

(22) Filed: Dec. 16, 2020

(65) Prior Publication Data
US 2022/0190126 A1    Jun. 16, 2022

(51) Int. Cl.
| | | |
|---|---|---|
| H01L 29/06 | (2006.01) | |
| H01L 29/417 | (2006.01) | |
| H01L 29/78 | (2006.01) | |
| H01L 23/66 | (2006.01) | |

(52) U.S. Cl.
CPC ........ H01L 29/41775 (2013.01); H01L 23/66 (2013.01); H01L 29/0642 (2013.01); H01L 29/7816 (2013.01)

(58) Field of Classification Search
CPC combination set(s) only.
See application file for complete search history.

(56) References Cited

U.S. PATENT DOCUMENTS

| | | |
|---|---|---|
| 5,668,392 A | 9/1997 | Huang et al. |
| 6,713,793 B1 | 3/2004 | Suzuki et al. |
| 7,005,713 B2 | 2/2006 | Mayer et al. |
| RE42,864 E | 10/2011 | Tsukanov et al. |
| 9,224,849 B2 | 12/2015 | Colinge et al. |

(Continued)

FOREIGN PATENT DOCUMENTS

| | | |
|---|---|---|
| DE | 19735425 A1 | 5/1998 |
| WO | WO-2020059322 A1 | 3/2020 |

OTHER PUBLICATIONS

Olsson, Jorgen at al.; "1 W/mm RF Power Density at 3.2 GHz for a Dual-Layer RESURF LDMOS Transistor;" IEEE Electron Device Letters; vol. 23, Issue 4; Apr. 2002; DOI: 10.1109/55.992840.

*Primary Examiner* — Moin M Rahman
(74) *Attorney, Agent, or Firm* — Bruce M. Green (57) ABSTRACT

A semiconductor device includes a semiconductor substrate, a first current-carrying electrode, a second current-carrying electrode, a first control electrode disposed between the first current-carrying electrode and the second current-carrying electrode, a third current-carrying electrode electrically coupled to the first current-carrying electrode, and a fourth current-carrying electrode adjacent the third current-carrying electrode. The third current-carrying electrode and the fourth current-carrying electrode are configured to support current flow from the third current-carrying electrode to the fourth current-carrying electrode parallel to a second direction. The fourth current-carrying element is electrically coupled to the second current-carrying electrode and a second control electrode. The second control electrode is electrically coupled to the first control electrode. A first crossing region is electrically coupled to the first control electrode and a second crossing region is electrically coupled to the fourth current-carrying electrode, wherein the second crossing region crosses a portion of the first crossing region.

19 Claims, 5 Drawing Sheets

(56) References Cited

U.S. PATENT DOCUMENTS

| | | | |
|---|---|---|---|
| 2017/0062319 A1* | 3/2017 | Guo | ............... H01L 23/498 |
| 2020/0075479 A1 | 3/2020 | Khalil et al. | |
| 2020/0258782 A1* | 8/2020 | Gu | ............ H01L 21/823418 |
| 2021/0257472 A1 | 8/2021 | Sato et al. | |

\* cited by examiner

SEMICONDUCTOR DEVICE WITH A CROSSING REGION

TECHNICAL FIELD

Embodiments of the subject matter described herein relate generally to semiconductor devices, including RF transistors.

BACKGROUND

Radio frequency transistors and integrated circuits find increasing use in high power, high frequency applications. Increasingly, these high power, high frequency applications require smaller chip size for higher levels of integration and reduced cost. Accordingly, there is a need for semiconductor devices with reduced chip size.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments of a semiconductor device are disclosed herein. In one aspect, the semiconductor device may include a semiconductor substrate that includes an upper surface and a lower surface. In an embodiment, a first current-carrying electrode may be formed over the semiconductor substrate. A second current-carrying electrode may be formed over the semiconductor substrate and adjacent the first current-carrying electrode, wherein the first current-carrying electrode and the second current-carrying electrode may be configured to support current flow from the first current-carrying electrode to the second current-carrying electrode parallel to a first direction, according to an embodiment. In an embodiment, a first control electrode may be formed over the semiconductor substrate and disposed between first current-carrying electrode and the second current-carrying electrode, wherein the first control electrode may control the flow of current from the first current-carrying electrode to the second current-carrying electrode parallel to the first direction. According to an embodiment, a third current-carrying electrode may be formed over the semiconductor substrate and coupled to the first current-carrying electrode. A fourth current-carrying electrode may be formed over the semiconductor substrate adjacent the third current-carrying electrode, wherein the third current-carrying electrode and the fourth current-carrying electrode may be configured to support current flow from the third current-carrying electrode to the fourth current-carrying electrode in a second direction, and wherein the fourth current-carrying element may be electrically coupled to the second current-carrying element, according to an embodiment. In an embodiment, a second control electrode may be formed over the semiconductor substrate and may be disposed between the third current-carrying electrode and the fourth current-carrying electrode, wherein the second control element controls the flow of current from the third current-carrying electrode to the fourth current-carrying electrode in the second direction. According to an embodiment, the second control electrode may be electrically coupled to the first control electrode. A first crossing region may be electrically coupled to the first control electrode, according to an embodiment. In an embodiment, a second crossing region may be electrically coupled to the fourth current-carrying electrode, wherein the second crossing region crosses a portion of the first crossing region, according to an embodiment.

In an embodiment, the semiconductor device may include a first active area formed in the semiconductor substrate that is electrically coupled to the first current-carrying electrode, the second current-carrying electrode, and the first control electrode. A second active area may be formed in the semiconductor substrate and may be electrically coupled to the third current-carrying electrode, the fourth current-carrying electrode, and the second control electrode, according to an embodiment. In an embodiment, an isolation region may be formed in the semiconductor substrate that electrically isolates the first active area from the second active area. A continuous electrical connection may be included between the first active area and the second active area, according to an embodiment.

In an embodiment, a fifth current-carrying electrode may be formed over the semiconductor substrate and may be coupled to the third current-carrying electrode. In an embodiment, a sixth current carrying electrode may be formed over the semiconductor substrate and coupled to the second current-carrying electrode. A seventh current-carrying electrode may be formed over the semiconductor substrate and coupled to the third current-carrying electrode, according to an embodiment. In an embodiment, an eighth current carrying electrode may be formed over the semiconductor substrate and coupled to the second current-carrying electrode. The first current-carrying electrode may be configured as source electrode and the second current-carrying electrode may be configured drain electrode, according to an embodiment. In an embodiment, the first current-carrying electrode may be configured as a drain electrode and the second current-carrying electrode may be configured as a source electrode. In an embodiment, the first direction and the second direction have a first angle between 60 degrees and 90 degrees between the first direction and the second direction. In other embodiments, first direction and the second direction may have a first angle of between 30 degrees and 60 between the first direction and the second direction. In an embodiment, a shield electrode may be disposed between a portion of the control electrode and the second current-carrying electrode. In an embodiment, the semiconductor substrate may include silicon. In some embodiments, the semiconductor device may be configured as a laterally diffused metal oxide semiconductor field effect transistor. In other embodiments, the semiconductor substrate may include one of gallium nitride, gallium oxide, gallium arsenide, indium phosphide, and silicon germanium.

In another aspect of the inventive subject matter and, according to an embodiment, a transistor device may include a semiconductor substrate that includes an upper surface and a lower surface. A first active area, formed within the semiconductor substrate, may be defined by an isolation area, according to an embodiment. In an embodiment, a second active area may be formed with the semiconductor substrate and may be defined by the isolation area. A first source electrode may be formed over the semiconductor substrate within the first active area, according to an embodiment. In an embodiment, a first drain electrode may be formed over the semiconductor substrate within the first active area and adjacent the first source electrode, wherein the first source electrode and the first drain electrode may be configured to support current flow parallel to a first direction. A first gate electrode may be formed over the semiconductor substrate in the first active area and disposed between first source electrode and the first drain electrode, wherein the first gate electrode controls the flow of current from the first source electrode to the first drain electrode in the first direction, according to an embodiment. In an embodiment, a second source electrode may be formed over the semiconductor substrate in the second active area and may be coupled to the first source electrode. A second drain electrode may be formed over the semiconductor substrate in the second active area, adjacent the second source electrode, and coupled to the first drain electrode, wherein the second source electrode and the second drain electrode may be configured to support current flow parallel to a second direction, according to an embodiment. In an embodiment, a second gate electrode may be formed over the semiconductor substrate in the second active area, disposed between the second source electrode and the second drain electrode, and may be coupled to the first gate electrode, wherein the second gate electrode controls the flow of current from the second source electrode to the second drain electrode in the second direction. A first crossing region may be electrically coupled to the first gate electrode and a second crossing region may be electrically coupled to the second drain electrode, wherein the second crossing region may cross a portion of the first crossing region.

Figure 1A:
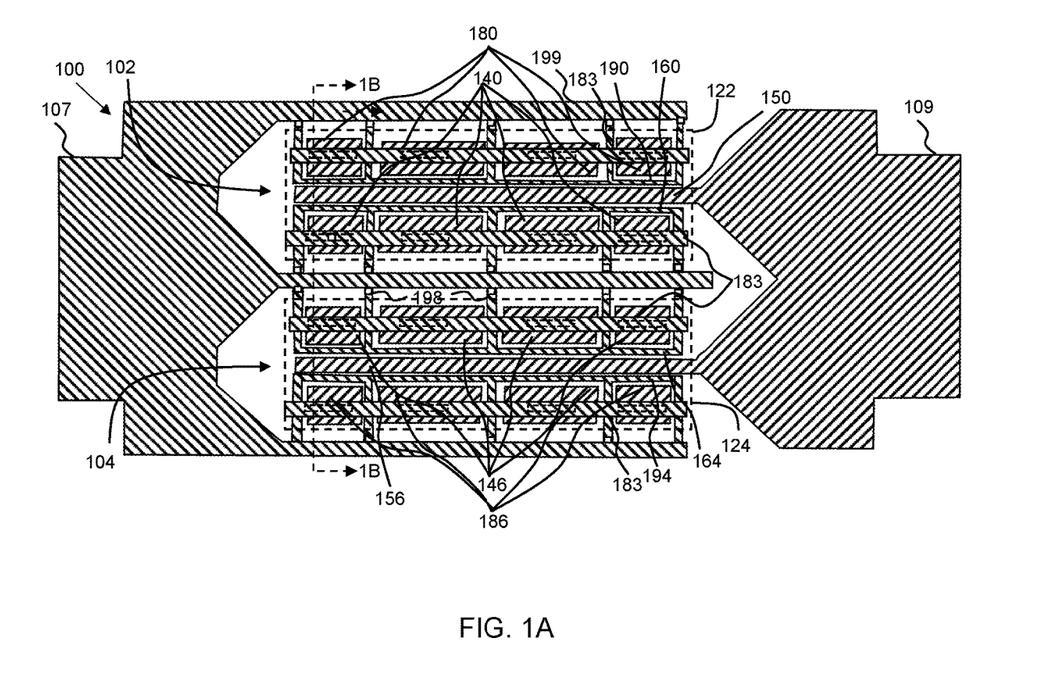
FIG. 1A is a top view of a conventional device.
Figure 1B:
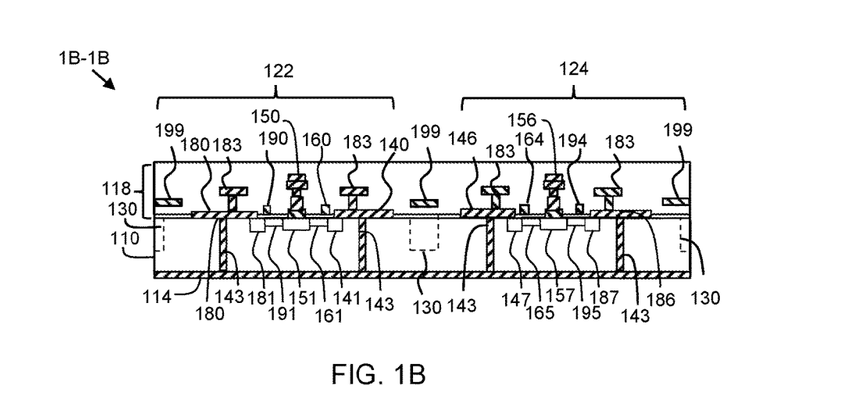
FIG. 1B is a cross sectional view of the conventional device of FIG. 1A along line 1B-1B

FIG. 1A is a top view and FIG. 1B is a cross sectional view of a conventional transistor device 100 along cut line 1B-1B of FIG. 1A. The conventional transistor device 100 includes first and second transistor fingers 102 and 104. As most clearly depicted in FIGS. 1A and 1B, each of the first and second transistor fingers 102, 104 corresponds to a small FET. The first transistor finger 102 includes source electrodes 140, 180, drain electrode 150, and gate electrodes 160, 190. A second transistor finger 104 includes source electrodes 146, 186 drain electrode 156, and gate electrodes 164, 194. Each of the first and second transistor fingers 102, 104 has an elongated active area 122, 124 defined, in part, by isolation regions 130 in which a width of the finger or gate (i.e., a dimension extending along an axis between a gate pad 107 and a drain pad 109) is significantly larger than a length of the finger or gate (i.e., a dimension extending along an axis that is perpendicular to the width). For example, the finger/unit gate widths may be in a range of about 50 microns to about 1200 microns, and the gate lengths may be in a range of about 0.1 microns to about 1 micron. The active area 122 includes a plurality of elongated, parallel-aligned source electrodes 140, 180 and drain electrode 150 where the drain electrode 150 and each source electrode 140, 180 contact doped semiconductor source regions 141 and 181 as well as the doped semiconductor drain region 151 formed in the semiconductor substrate 110. Variably-conductive channels 161 and 191 are present between adjacent source and drain regions 141, 181, 151. Likewise, the active area 124 includes a plurality of elongated, parallel-aligned source electrodes 146, 186 and drain electrode 156 where the drain electrode 156 and each source electrode 146, 186 contacts source regions 147 and 187 as well as a drain region 157 formed in the semiconductor substrate 110. Variably-conductive channel regions 165, 195 are present between adjacent source and drain regions 147, 157, 187. Shield electrodes 183 are coupled to the source electrodes by forming an additional conductive layer over the source electrodes 140, 180, 146, 186 in transistor fingers 102 and 104.

Gate electrodes 160, 190, 164, 194 are formed in the first and second transistor fingers 102 and 104 in the build-up structure 118 formed over the top surface of the semiconductor substrate 110. Each gate electrode 160, 164, 190, 194 extends over and along the length of channel regions 161, 165, 191, 195. Each gate electrode 160, 164, 190, 194 is electrically coupled (e.g., through conductive vias and patterned conductive layers in build-up structure 118) at multiple points along its length to elongated, conductive gate structures and "runners" 198, which in turn are electrically coupled to the gate pad 107. Similarly, drain electrodes 150, 156 are formed in the build-up structure 118 over the top surface of the base semiconductor substrate 110. Each drain electrode 150, 156 extends over and along the length of a drain region 151, 155. Finally, the source regions 141, 147, 181, 187 are electrically coupled to source electrodes 140, 146, 180, 186 which, in turn, are coupled to conductive through-wafer source vias (TSVs) (e.g., TSV 143) that extend through the semiconductor substrate (e.g., substrate 110) to connect with a conductive layer (e.g., layer 114) on the bottom surface of the semiconductor substrate 110.

Figure 2A:
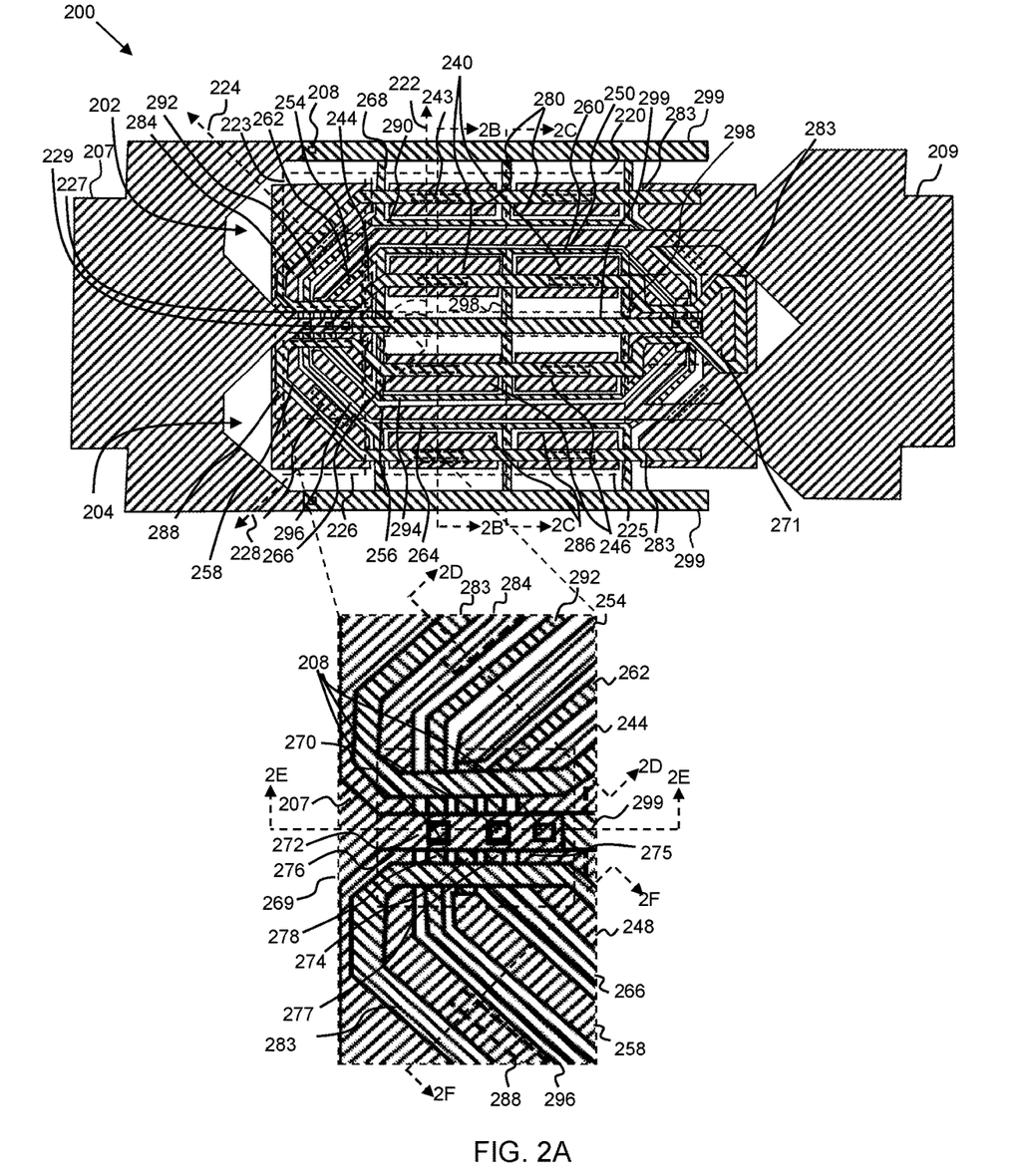
FIG. 2A is a top view of a transistor device in accordance with an embodiment.
Figure 2B:
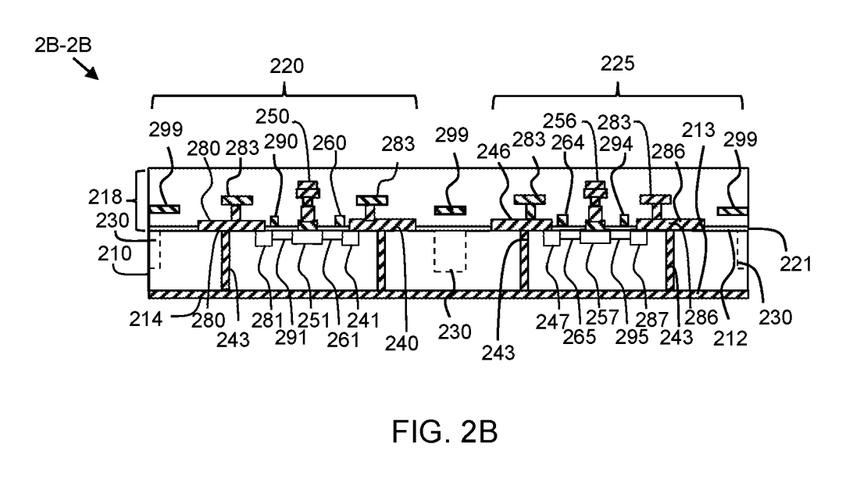
FIG. 2B is a cross sectional view of the transistor device of FIG. 2A along line 2B-2B in accordance with an embodiment.
Figure 2C:
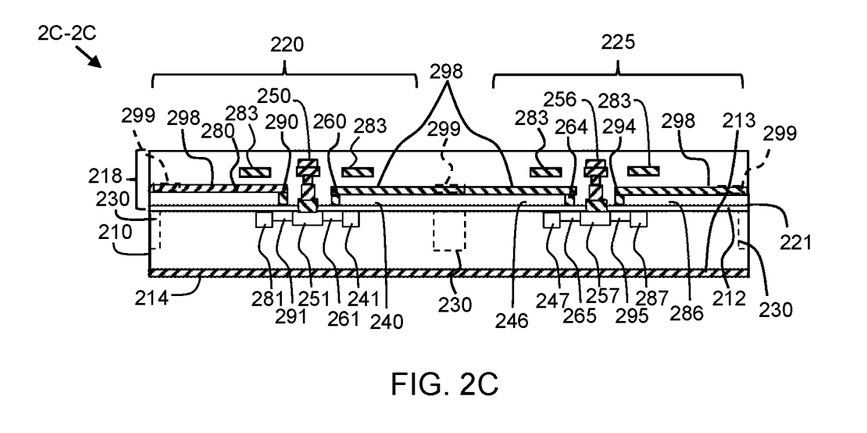
FIG. 2C is a cross sectional view of the transistor of FIG. 2A along line 2C-2C in accordance with an embodiment.
Figure 2D:
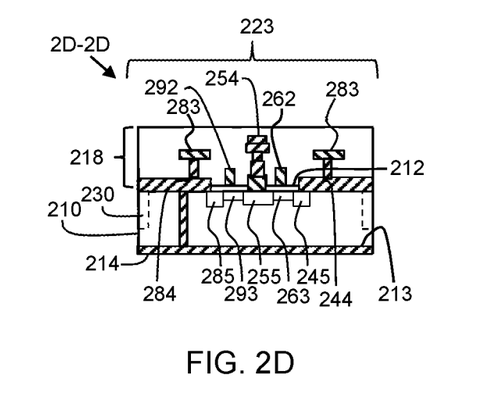
FIG. 2D is a cross sectional view of the transistor device of FIG. 2A along line 2D-2D in accordance with an embodiment.
Figure 2E:
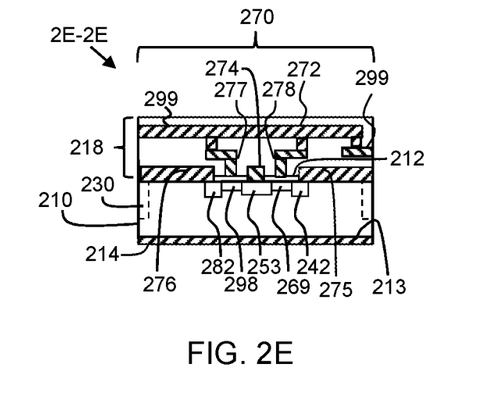
FIG. 2E is a cross sectional view of the transistor device of FIG. 2A along line 2E-2E in accordance with an embodiment.
Figure 2F:
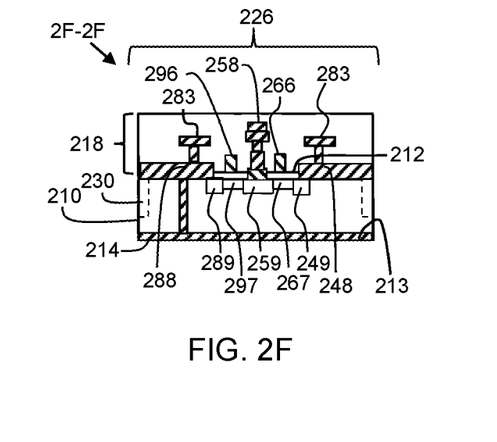
FIG. 2F is a cross sectional view of the transistor device of FIG. 2A along line 2F-2F in accordance with an embodiment.

FIG. 2A is a top view and FIGS. 2B, 2C, 2D, 2E, and 2F are cross sectional views of a transistor device 200 along cut-lines 2B-2B, 2C-2C, 2D-2D, 2E-2E, and 2F-2F. As most clearly depicted in FIGS. 2A, 2B, 2C, 2D, 2E, and 2F, and according to an embodiment, a semiconductor device may be configured as a transistor device 200 that includes first and second transistor fingers 202, 204 that are electrically coupled to a gate pad 207 and a drain pad 209. For example, each of first and second transistor fingers 202, 204 may be a metal-oxide-semiconductor field effect transistor (MOSFET), a laterally-diffused MOSFET (LDMOS FET), an enhancement-mode or depletion-mode high electron mobility transistor (HEMT), or another type of FET. According to various embodiments, transistor device 200 may be implemented, for example, using a silicon-based FET, a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET). In a specific embodiment, transistor device 200 is a laterally-diffused metal oxide semiconductor (LDMOS) FET device that includes a number of source electrodes, drain electrodes, and gate electrodes. Without departing from the scope inventive subject matter, other embodiments may include bipolar transistors, e.g., bipolar transistors (BJT's) and heterojunction bipolar transistors (HBT's) (not shown). In these other embodiments, a source electrode corresponds to an emitter electrode, a drain electrode corresponds to a collector electrode, and a gate electrode corresponds to a base electrode.

In an embodiment, the transistor device 200 may include a semiconductor substrate 210 having an upper surface 212 and a lower surface 213. Each of the first and second transistor fingers 202 and 204 may be formed within and over the semiconductor substrate 210. Each of the first and second transistor fingers 202, 204 may include first and second central active areas 220 and 225 ("first active area" and "third active area") and first and second end active areas 223 and 226 ("second active area" and "fourth active area"), respectively. According to an embodiment, each of the first and second central active areas 220 and 225 and first and second end active areas 223 and 226 are elongated active areas in which a width of the finger or gate (i.e., a dimension extending along an axis perpendicular to the direction of current flow between a source and drain electrode is larger than a length of the finger or gate (i.e., a dimension extending along an axis that is perpendicular to the width). For example, the finger/unit gate widths may be in a range of about 50 microns to about 1200 microns, and the gate lengths may be in a range of about 0.1 microns to about 1 micron, according to an embodiment. In an embodiment, the first central and end active areas 220 and 223 may include a plurality of elongated source electrodes 240, 280, 244, 284 and drain electrodes 250, 254. The drain electrodes 250 and 254 and each source electrode 240, 280, 244, 284 may contact doped semiconductor source regions 241, 281, 245, 285 as well as the doped semiconductor drain regions 251, 255 formed in the semiconductor substrate 210. Variably-conductive channel regions 261, 263, 291, 293 (and, in some embodiments, a drain drift region) may be present between adjacent source and drain regions 241, 281, 251, 245, 285, 255, according to an embodiment. Likewise, and in an embodiment, the second central and end active areas 225 and 226 may include a plurality of elongated source electrodes 246, 286, 248, 288 and drain electrodes 256, 258 where the drain electrodes 256, 258 and each source electrode 246, 286, 248, 288 may contact doped semiconductor source regions 247, 287, 249, 289 as well as doped semiconductor drain regions 257, 259 formed in the semiconductor substrate 210. Variably-conductive channels 265, 267, 295, 297 (and, in some embodiments, a drain drift region) may be present between adjacent source and drain regions 247, 287, 257, 249, 289, 259.

Conductive (e.g., polysilicon or metal) gate electrodes 260, 262, 264, 266, 290, 292, 294, 296 are formed in the first and second transistor fingers 202 and 204 in the build-up structure 218 over the top surface of the semiconductor substrate 210, according to an embodiment. In an embodiment, each gate electrode 260, 262, 264, 266, 290, 292, 294, 296 extends over and along the length of channel regions 261, 263, 265, 267, 291, 293, 295, 297. Each gate electrode 260, 262, 264, 266, 290, 292, 294, 296 may be electrically coupled (e.g., through conductive vias and patterned conductive layers in build-up structure 218) at multiple points along its length to elongated, conductive gate structures and "runners" 268, which in turn are electrically coupled to the gate pad 207, according to an embodiment. Similarly, and in an embodiment, conductive (e.g., polysilicon or metal) drain electrodes 250, 254, 256, 258 may be formed in the build-up structure 218 over the top surface of the semiconductor substrate 210. Each drain electrode 250, 254, 256, 258 may extend over and along the length of respective drain regions 251, 255, 257, 259, according to an embodiment. Finally, the source regions 241, 245, 247, 249 may be electrically coupled to conductive (e.g., polysilicon or metal) source electrodes 240, 244, 246, 248 which in turn are coupled to conductive TSVs 243 that extend through the semiconductor substrate 210 to connect with a conductive layer (e.g., layer 214) on the bottom surface of the semiconductor substrate 210. In some embodiments, the source electrodes 240, 244, 246, 248 between adjacent fingers 202, 204 may be replaced with a single source contact and TSV(s) (i.e., a shared electrical connection to the conductive layer 414 may be implemented between the source contacts 240, 244 and 246, 248 of adjacent fingers 202, 204). Either way, voltages applied to the gate electrodes 260, 262, 264, 266 during operation modulate the conductivity of the variably-conductive channel regions 261, 263, 265, 267, thus enabling current flow between source and drain regions (or ultimately between conductive layer 214 and each drain electrode 250, 254, 256, 258).

In the example embodiment illustrated in FIGS. 2A-2F, in each transistor finger 202, 204, source electrodes 240, 244, 246, 248 and adjacent source electrodes 280, 284, 286, 288 may be present on both sides of a single drain electrode 250, 254, 256, 258, and gate electrodes 260, 262, 264, 266 and adjacent gate electrodes 290, 292, 294, 296 may also be present on both sides of each drain electrodes 250, 254, 256, and 258. Accordingly, each transistor finger 202, 204 essentially may be symmetric about a central drain electrode 250, 254, 256, 258, according to an embodiment. During operation, and in an embodiment, current may be drawn into each drain electrode 250, 254, 256, 258 from the associated drain regions 251, 255, 257, 259 that collect electrons from source regions 241, 245, 247, 249, 281, 285, 287, and 289 (and through the channel regions 261, 263, 265, 267, 291, 293, 295, 297) on either side of each drain region 251, 255, 257, 259. In other embodiments (not shown), each transistor finger 202, 204 may include only a single source region and a single drain region, or may be otherwise configured.

The first and second central active areas 220, 225 and first and second end active areas 223, 226 may be defined by isolation regions 230. The Isolation regions 230 may be formed by implant isolation or deep trench isolation (DTI), according to an embodiment.

In an embodiment, the active areas within each of the first and second fingers 202 and 204 may be arranged so that current may flow parallel to a first direction 222 in the first and second central active areas 220, 225, in a second direction 224 in the first end active area 223, and in a third direction 228 in the second active area 226. In an embodiment, a first angle 227 between the first and second directions 222 and 224 may be between about 0 degrees and about 90 degrees. In an embodiment, the first angle 227 between the first and second directions 222 and 224 may be between about 30 degrees and about 60 degrees, though other angles may be used. By orienting the central active areas 220 and 225 and end active areas 223 and 226 so that their respective current flow at the first angle 227 between them, it may be possible to realize a compact layout that takes advantage of the area available for active device elements within the first and second central active areas 220 and 225 as well as the first and second end active areas 223 and 226 of each transistor finger 202 and 204. In the example transistor device 200, and according to an embodiment, end active areas 223 and 226 may be formed on each end of the transistor device 200 as shown. In other embodiments, end active areas may be formed on a single end of the transistor fingers 202 and 204 (not shown). In still other embodiments, end active areas may be formed on some but not all transistor fingers (not shown). Without departing from the scope of the inventive subject matter, other embodiments may include more than two transistor fingers (not shown).

The first transistor finger 202 may include a source terminal (i.e. "current-carrying electrode") 240, a drain electrode (i.e. "current-carrying electrode") 250, and a gate electrode (i.e. "control electrode") 260. These elements may be formed over the semiconductor substrate in the first central active area 220 and within the process layer build-up structure 218 (e.g. stack of conductive and insulating layers), according to an embodiment. In an embodiment, the source electrode 240 and the drain electrode 250 may be formed over the upper surface 212 of the semiconductor substrate 210 in the first central active area 220, adjacent to each other, and are configured to support current flow parallel to a first direction 222 (e.g. from first source electrode 240 to first drain electrode 250). The source electrode 240 and the drain electrode 250 may be electrically coupled to the channel region 261 in the semiconductor substrate through doped source and drain regions 241 and 251. In an embodiment, the gate electrode 260 may be formed in the first active area 220 between the source electrode 240 and the drain electrode 250 and may be configured to control the current flow through the channel region 261 from the source electrode 240 to the drain electrode 250 in the first direction 222. In an embodiment, the gate electrode 260 may control the current in the channel region 261 (e.g. an inversion layer) formed under the gate electrode 260. The gate electrode 260 may be formed using a conductive material (e.g. metal or poly silicon) formed over a gate dielectric layer 221, according to an embodiment.

According to an embodiment, the end active area 223 of the first transistor finger 202 may include a source electrode 244 formed over the upper surface 212 of the semiconductor substrate 210 that may be electrically coupled to the source electrode 240 through one or more through wafer source vias (TSV's) 243 and conductive layer 214 and/or a physical connection between the source electrode 240 and the source electrode 244. The drain electrode 254 may be formed over the semiconductor substrate 210 adjacent the source electrode 244, according to an embodiment. In an embodiment, the source electrode 244 and the drain electrode 254 may fold around an end of transistor finger 202 and may be configured to support current flow from the source electrode 244 to the drain electrode 254 in a second direction 224. The drain electrode 254 may be electrically coupled to the drain electrode 250 through conductive material (e.g. metals) used to form the drain electrodes 250, 254, according to an embodiment. In an embodiment, a gate electrode 262 may be formed over the semiconductor substrate 210 between the source electrode 244 and the drain electrode 254, wherein the gate electrode 262 may be configured to control the flow of current from the source electrode 244 to the drain electrode 254 in the second direction 224. According to an embodiment, the gate electrode 262 may be electrically coupled to the gate electrode 260 via conductive materials (e.g. gate poly or gate metal) used to form the gate electrodes 260, 262. Gate electrodes 260, 262 may be electrically coupled to gate fingers 299 by gate runners 268 which then may be electrically coupled to gate pad 207 by gate via connectors 208, according to an embodiment.

According to an embodiment, the second transistor finger 204 of the transistor device 200 may include a source electrode 246 formed over the semiconductor substrate 210 in the second central active area 225. A drain electrode 256 may be formed over the semiconductor substrate 210 in the second central active area 225 and adjacent the source electrode 246, wherein the source electrode 246 and the drain electrode 256 are configured to support current flow from the source electrode 246 to the drain electrode 256 in the first direction 222, according to an embodiment. In an embodiment, the gate electrode 264 may be formed over the semiconductor substrate 210 and may be disposed between the source electrode 246 and the drain electrode 256, wherein the gate electrode 264 may be configured to control the flow of current from the source electrode 246 to the drain electrode 256.

In an embodiment, a source electrode 248 may be formed over the semiconductor substrate 210 in the second end active area 226 and may be coupled to the source electrode 246, according to an embodiment. In an embodiment, a drain electrode 258 may be formed in the second end active area 226 over the semiconductor substrate 210 and adjacent the drain electrode 256, wherein the source electrode 248 and the drain electrode 258 may be configured to support current flow from the source electrode 248 to the drain electrode 258 in a third direction 228, and wherein the drain electrode 258 may be electrically coupled to the drain electrode 256. Gate electrode 266 may be formed over the semiconductor substrate 210 between the source electrode 248 and the drain electrode 258, according to an embodiment. In an embodiment, gate electrode 266 may be electrically coupled to gate electrode 264. In an embodiment, a second angle 229 between the first direction 222 and the third direction 228 may be offset from the first angle 227 between the first direction 222 and second direction 224 by 90 degrees. For example, the first angle 227 may be 45 degrees, while the second angle 229 may be 135 degrees, though other angles for first and second angles 227 and 229 may be used in other embodiments.

In an embodiment, additional electrodes may be routed adjacent to the drain electrodes 250, 254, 256, and 258 to form additional transistor regions. For example, source electrode (i.e. 280 may be formed over the semiconductor substrate 210 adjacent to the drain electrode 250 and electrically coupled to the source electrode 240 and the source electrode 244. In an embodiment, gate electrode 290 may be formed over the semiconductor substrate 210 between the source electrode 280 and the drain electrode 250, wherein the gate electrode 290 may be configured to control the current flow from the source electrode 280 to the drain electrode 250. An adjacent source electrode 284 may be formed over the semiconductor substrate 210 adjacent to the drain electrode 254 and may be electrically coupled to the drain electrode 254 and the adjacent source electrode 280, wherein the adjacent source electrode 280 may be configured to support current flow from the adjacent source electrode 284 to the drain electrode 254 in the second direction 224, according to an embodiment. In an embodiment, adjacent gate electrode 292 may be formed over the semiconductor substrate 210 between the adjacent source electrode 284 and the drain electrode 254, wherein the gate electrode 292 is configured to control the current flow from the adjacent source electrode 284 to the drain electrode 254.

Likewise, and according to an embodiment, source electrode 286 may be formed adjacent the third drain electrode 256 and the gate electrode 294 may be formed between the drain electrode 256 and the third source electrode 286 to control current flow between the source electrode 286 and the drain electrode 256 in the first direction 222. The source electrode 288 may be formed adjacent the drain electrode 258 and the gate electrode 296 may be formed between the drain electrode 258 and the source electrode 288 to control current flow between the source electrode 288 and the drain electrode 258 in the third direction 228, according to an embodiment.

In an embodiment, a shield electrode 283 may be formed between the gate fingers 299 and the drain electrodes 250, 254, 256, and 258. The shield electrode 283 may be formed over and electrically coupled to the source electrodes 240, 244, 246, 248, 280, 284, 286, and 288, according to an embodiment. The shield electrode 283 may be formed from a conductive material and may be formed using the same conducting layers as other features of the transistor device 200 (e.g. gate pad 207), according to an embodiment. In an embodiment, the shield electrode 283 may function to decrease electrical coupling between the gate fingers 299 as well as their electrically coupled gate electrodes 260, 262, 264, 266, 290, 292, 294, and 296 and the drain electrodes 250, 254, 256, 258.

In an embodiment, and to enable electrical connection between the first and second transistor fingers 202 and 204, a crossing region 270 may be formed as a continuation of and as a link between the transistor structures at one or, in the example transistor device 200, both ends of the transistor fingers 202 and 204, according to an embodiment. In an embodiment, the crossing region 270 may act as a transistor region and includes at least one drain electrode in the form of a drain crossing region 274, source electrodes in the form of source crossing regions 275 and 276, and gate electrodes in the form of gate electrode crossing regions 277 and 278. In an embodiment, gate finger crossing region 272 (i.e. "first crossing region") may be electrically coupled to gate electrode 260 (e.g. via gate fingers 299 and gate runners 268). The drain crossing region (i.e. "second crossing region") 274 may electrically couple the drain electrodes 254, 258 and may be electrically coupled to a doped drain region 253, according to an embodiment. In an embodiment, the drain crossing region 274 may cross at least a portion of the gate crossing region 272, according to an embodiment. The drain crossing region 274 may be realized using a portion (e.g., a lower portion) of a conductive material (e.g. metal stack or polysilicon) used to realize the drain electrodes 254, 258. In an embodiment, a source crossing region (i.e. "third crossing region") 275 may electrically couple the source electrodes 244, 248, and may be coupled to a doped source region 242. In an embodiment, an adjacent source crossing region 276 may be coupled to adjacent source electrodes 284, 288. In an embodiment, a gate electrode crossing region 277 ("fourth crossing region") may electrically couple gate electrodes 262 and 266 and may be electrically coupled to a variable-conductive channel region 269. An adjacent gate electrode crossing region 278 may couple adjacent gate electrodes 292, 296, and may be electrically coupled to a variable-conductive channel region 298, according to an embodiment. Without departing from the scope of the inventive subject matter, the crossing region 270 may be realized as a passive structure in some embodiments. In these embodiments, the drain crossing region 274, source crossing regions 275 and 276, and gate electrode crossing regions 277 and 278 may not include doped drain region 253, doped source region 242, and variable-conductive channel regions 269 and 298. As used herein, the term "crossing" means having one element directly above or below another element. For example, the drain crossing region 274 is crossing the gate finger crossing region 270. Likewise, gate electrode crossing regions 277, 278 and source crossing regions 275, 276 are crossing the gate finger crossing region 270.

In an embodiment, the transistor device 200 may include additional crossing region(s) (e.g. end crossing region 271) on opposite ends of transistor fingers 202 and 204, as shown in FIG. 2A. The end crossing region 271 may electrically couple sources, drains, and gates with similar form and function to that of source electrodes 244, 284, 248, 288, drain electrodes 254, 258, and gate electrodes 262, 292, 266, 296.

Figure 3:
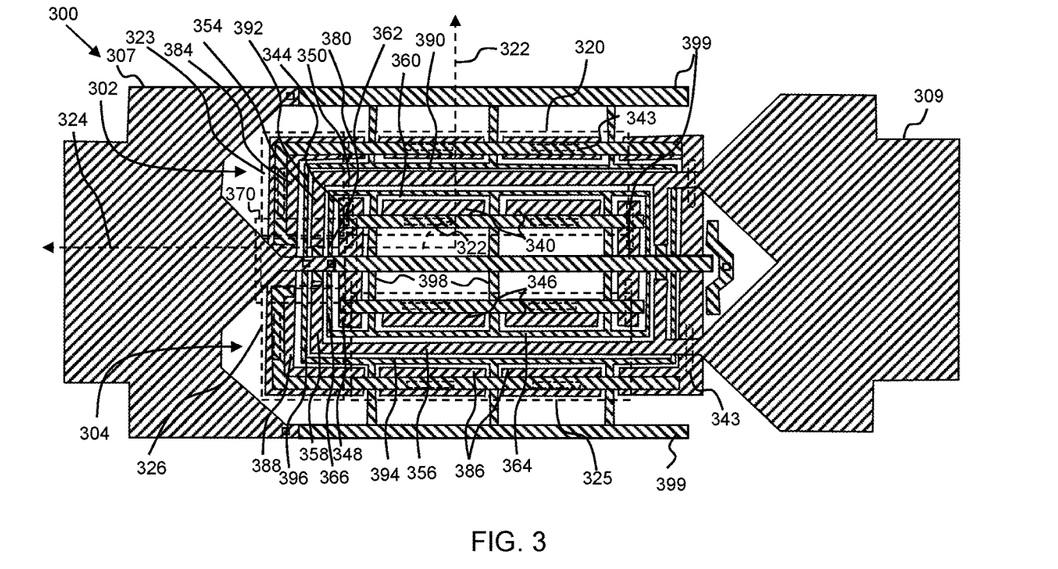
FIG. 3 is a top view of a transistor device in accordance with an embodiment.
Figure 4:
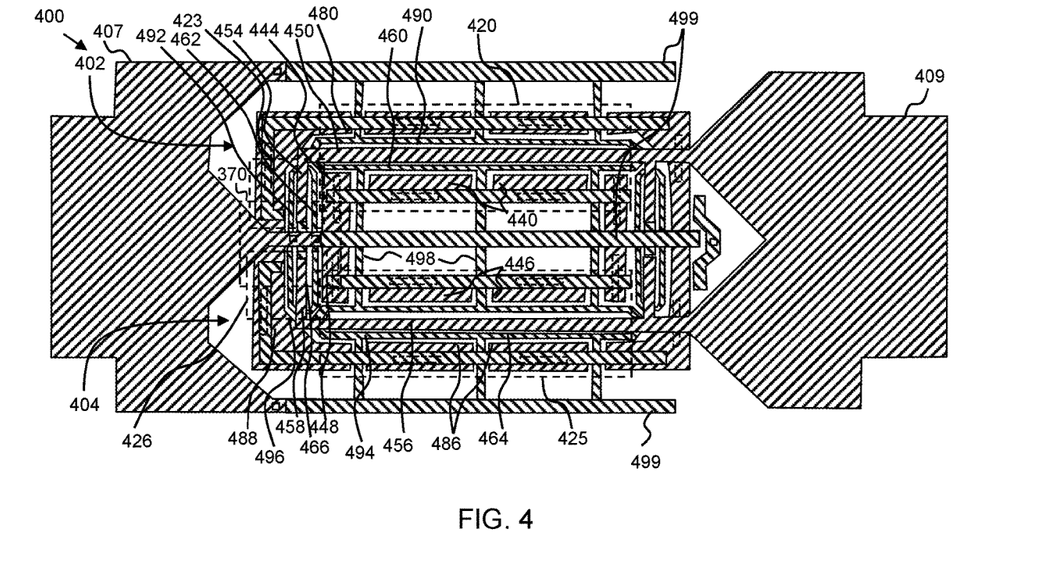
FIG. 4 is a top view of a transistor device in accordance with an embodiment.

FIGS. 3-4 are top views of example transistor devices 300 and 400 in accordance with embodiments of the inventive subject matter. Many features of the transistor device 300 are analogous in form and function of like numbered features of the device 200 of FIG. 2 (e.g. 210, 220, 230, 240, 250, 260, 270, etc.), except with numbers that begin with "3" or "4". Thus, for the sake of brevity, where they are the same as in FIG. 2 and not needed to describe unique features of transistor devices 300 and 400 relative to transistor device 200, the details of these features are not described in detail here.

As shown in FIG. 3, and for an example embodiment of a transistor device 300, a first central active area ("first active area") 320 and first end active area ("second active area") 325 may be configured such that the current flow from a source electrode ("current-carrying electrode") 340 to a drain electrode 350 may be parallel to a first direction 322 while the current flow from a source electrode 344 to a drain electrode 354 may be parallel to a second direction 324. In an embodiment, the first angle 327 between the first and second directions 324 and 324 may be approximately 90 degrees.

As shown in FIG. 4, and in an example embodiment of a transistor device 400, a first central active area ("first active area") 420 and first end active area ("second active area") 423 may be configured such that the first central active area 420 is isolated from the first end active area 423 within the semiconductor substrate 410. This isolation between the first central active area 420 and the first end active area 423 may be accomplished using implant isolation, deep trench isolation, or other suitable means according to an embodiment. In an embodiment, source electrode 440 formed within the first central active area 420 may be electrically coupled to source electrode 444 formed within the end active area 425, according to an embodiment. The gate electrode 460 may be electrically isolated from the gate electrode 462, according to an embodiment. In an embodiment, each the gate electrodes 460 and 462 may wrap around a portion of the drain electrodes 450 and 454. Likewise, a drain electrode 450 formed within the central active area 420 may be electrically coupled to the drain electrode 454 formed within the end active area 425, according to an embodiment.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
   a semiconductor substrate that includes an upper surface and a lower surface;
   a first current-carrying electrode formed over the semiconductor substrate;
   a second current-carrying electrode formed over the semiconductor substrate and adjacent the first current-carrying electrode, wherein the first current-carrying electrode and the second current-carrying electrode are configured to support current flow from the first current-carrying electrode to the second current-carrying electrode parallel to a first direction;
   a first control electrode formed over the semiconductor substrate and disposed between first current-carrying electrode and the second current-carrying electrode, wherein the first control electrode is configured to control the flow of current from the first current-carrying electrode to the second current-carrying electrode;
   a third current-carrying electrode formed over the semiconductor substrate and electrically coupled to the first current-carrying electrode;
   a fourth current-carrying electrode formed over the semiconductor substrate and adjacent the third current-carrying electrode, wherein the third current-carrying electrode and the fourth current-carrying electrode are configured to support current flow from the third current-carrying electrode to the fourth current-carrying electrode parallel to a second direction, and wherein the fourth current-carrying element is electrically coupled to the second current-carrying electrode;
   a second control electrode formed over the semiconductor substrate and disposed between the third current-carrying electrode and the fourth current-carrying electrode, wherein the second control element is configured to control the flow of current from the third current-carrying electrode to the fourth current-carrying electrode, and wherein the second control electrode is electrically coupled to the first control electrode;
   a first crossing region electrically coupled to the first control electrode;
   a second crossing region electrically coupled to the coupled to the fourth current-carrying electrode, wherein the second crossing region crosses a portion of the first crossing region;
   a first adjacent current-carrying electrode, formed over the semiconductor substrate adjacent to the second current-carrying electrode and electrically coupled to the first current-carrying electrode and the third current-carrying electrode, wherein the first adjacent current-carrying electrode is configured to support current flow from the first adjacent current-carrying electrode to the second current-carrying electrode in the first direction;
   a first adjacent control electrode, formed over the semiconductor substrate between the first adjacent current-carrying electrode and the second current-carrying electrode, wherein the first adjacent control electrode is configured to control the current flow from the first adjacent current-carrying electrode to the second current-carrying electrode;
   a second adjacent current-carrying electrode, formed over the semiconductor substrate adjacent to the fourth current-carrying electrode and electrically coupled to the first current-carrying electrode, the third current-carrying electrode, and the a first adjacent current-carrying electrode, wherein the second adjacent current-carrying electrode is configured to support current flow from the second adjacent current-carrying electrode to the fourth current-carrying electrode in the second direction; and
   a second adjacent control electrode formed over the semiconductor substrate between the second adjacent current-carrying electrode and the fourth current-carrying electrode, wherein the second adjacent control electrode is configured to control the current flow from the second adjacent current-carrying electrode to the fourth current-carrying electrode.

2. The semiconductor device of claim 1, further comprising:
   a first active area formed in the semiconductor substrate, electrically coupled to the first current-carrying electrode, the second current-carrying electrode, and the first control electrode; and
   a second active area formed in the semiconductor substrate, electrically coupled to the third current-carrying electrode, the fourth current-carrying electrode, and the second control electrode.

3. The semiconductor device of claim 2, further comprising an isolation region formed in the semiconductor substrate that electrically isolates the first active area from the second active area.

4. The semiconductor device of claim 2, further comprising a continuous electrical connection between the first active area and the second active area.

5. A semiconductor device comprising:
   a semiconductor substrate that includes an upper surface and a lower surface;
   a first current-carrying electrode formed over the semiconductor substrate;
   a second current-carrying electrode formed over the semiconductor substrate and adjacent the first current-carrying electrode, wherein the first current-carrying electrode and the second current-carrying electrode are configured to support current flow from the first current-carrying electrode to the second current-carrying electrode parallel to a first direction;

a first control electrode formed over the semiconductor substrate and disposed between first current-carrying electrode and the second current-carrying electrode, wherein the first control electrode is configured to control the flow of current from the first current-carrying electrode to the second current-carrying electrode;

a third current-carrying electrode formed over the semiconductor substrate and electrically coupled to the first current-carrying electrode;

a fourth current-carrying electrode formed over the semiconductor substrate and adjacent the third current-carrying electrode, wherein the third current-carrying electrode and the fourth current-carrying electrode are configured to support current flow from the third current-carrying electrode to the fourth current-carrying electrode parallel to a second direction, and wherein the fourth current-carrying element is electrically coupled to the second current-carrying electrode;

a second control electrode formed over the semiconductor substrate and disposed between the third current-carrying electrode and the fourth current-carrying electrode, wherein the second control element is configured to control the flow of current from the third current-carrying electrode to the fourth current-carrying electrode, and wherein the second control electrode is electrically coupled to the first control electrode;

a first crossing region electrically coupled to the first control electrode;

a second crossing region electrically coupled to the coupled to the fourth current-carrying electrode, wherein the second crossing region crosses a portion of the first crossing region;

a first active area formed in the semiconductor substrate, electrically coupled to the first current-carrying electrode, the second current-carrying electrode, and the first control electrode;

a second active area formed in the semiconductor substrate, electrically coupled to the third current-carrying electrode, the fourth current-carrying electrode, and the second control electrode;

a fifth current-carrying electrode formed over the semiconductor substrate, a sixth current-carrying electrode formed over the semiconductor substrate and adjacent the fifth current-carrying electrode, wherein the fifth current-carrying electrode and the sixth current-carrying electrode are configured to support current flow from the fifth current-carrying electrode to the sixth current-carrying electrode parallel to the first direction;

a third control electrode formed over the semiconductor substrate and disposed between fifth current-carrying electrode and the sixth current-carrying electrode, wherein the third control electrode is configured to control the flow of current from the fifth current-carrying electrode to the sixth current-carrying electrode;

a seventh current-carrying electrode formed over the semiconductor substrate and coupled to the fifth current-carrying electrode;

an eighth current-carrying electrode formed over the semiconductor substrate and adjacent the seventh current-carrying electrode, wherein the seventh current-carrying electrode and the eighth current-carrying electrode are configured to support current flow from the seventh current-carrying electrode to the eighth current-carrying electrode parallel to a third direction, and wherein the eighth current-carrying electrode is electrically coupled to the sixth current-carrying electrode;

a fourth control electrode formed over the semiconductor substrate and disposed between the seventh current-carrying electrode and the eighth current-carrying electrode, wherein the fourth control element is configured to control the flow of current from the seventh current-carrying electrode and the eighth current-carrying electrode, and wherein the fourth control electrode is electrically coupled to the third control electrode; and wherein the eighth current-carrying electrode is electrically coupled to the second crossing region.

6. The semiconductor device of claim 5, further comprising:

a first transistor finger comprising the first current-carrying electrode, the second current-carrying electrode, the first control electrode, the third current-carrying electrode, the fourth current-carrying electrode, and the second control electrode; and a second transistor finger comprising the fifth current-carrying electrode, the sixth current-carrying electrode, the third control electrode, the seventh current-carrying electrode, the eighth current-carrying electrode, and the fourth control electrode.

7. The semiconductor device of claim 5, wherein the first current-carrying electrode is configured as a source electrode, the second current-carrying electrode is configured as a drain electrode, the first control electrode is configured as a gate electrode, the third current-carrying electrode is configured as a source electrode, the fourth current-carrying electrode is configured as a drain electrode, the second control electrode is configured as a gate electrode, the fifth current-carrying electrode is configured as a source electrode, the sixth current-carrying electrode is configured as a drain electrode, the third control electrode is configured as a gate electrode, the seventh current-carrying electrode is configured as a source electrode, the eighth current-carrying electrode is configured as a drain electrode, and the fourth control electrode is configured as a gate electrode.

8. The semiconductor device of claim 1, wherein the first current-carrying electrode is configured a source electrode and the second current-carrying electrode is configured as a drain electrode.

9. The semiconductor device of claim 1, wherein the first current-carrying electrode is configured as a drain electrode and the second current-carrying electrode is configured as a source electrode.

10. The semiconductor device of claim 1, wherein the first direction and the second direction have a first angle of between approximately 60 degrees and approximately 90 degrees between the first direction and the second direction.

11. The semiconductor device of claim 1, wherein the first direction and the second direction have a first angle of approximately 30 degrees and approximately 60 degrees between the first direction and the second direction.

12. The semiconductor device of claim 1, further comprising a shield electrode disposed between a portion of the first control electrode and the second current-carrying electrode.

13. The semiconductor device of claim 1, wherein the semiconductor substrate comprises silicon.

14. A semiconductor device comprising:

a semiconductor substrate that includes an upper surface and a lower surface;

a first current-carrying electrode formed over the semiconductor substrate;
a second current-carrying electrode formed over the semiconductor substrate and adjacent the first current-carrying electrode, wherein the first current-carrying electrode and the second current-carrying electrode are configured to support current flow from the first current-carrying electrode to the second current-carrying electrode parallel to a first direction;
a first control electrode formed over the semiconductor substrate and disposed between first current-carrying electrode and the second current-carrying electrode, wherein the first control electrode is configured to control the flow of current from the first current-carrying electrode to the second current-carrying electrode;
a third current-carrying electrode formed over the semiconductor substrate and electrically coupled to the first current-carrying electrode;
a fourth current-carrying electrode formed over the semiconductor substrate and adjacent the third current-carrying electrode, wherein the third current-carrying electrode and the fourth current-carrying electrode are configured to support current flow from the third current-carrying electrode to the fourth current-carrying electrode parallel to a second direction, and wherein the fourth current-carrying element is electrically coupled to the second current-carrying electrode;
a second control electrode formed over the semiconductor substrate and disposed between the third current-carrying electrode and the fourth current-carrying electrode, wherein the second control element is configured to control the flow of current from the third current-carrying electrode to the fourth current-carrying electrode, and wherein the second control electrode is electrically coupled to the first control electrode;
a first crossing region electrically coupled to the first control electrode;
a second crossing region electrically coupled to the coupled to the fourth current-carrying electrode, wherein the second crossing region crosses a portion of the first crossing region;
wherein the semiconductor device is configured as a laterally diffused metal oxide semiconductor field effect transistor.

15. The semiconductor device of claim 1, wherein the semiconductor substrate includes a material selected from the group consisting of gallium nitride, gallium oxide, gallium arsenide, indium phosphide, and silicon germanium.

16. A transistor device comprising:
a semiconductor substrate that includes an upper surface and a lower surface;
a first active area, formed within the semiconductor substrate, and defined by an isolation area;
a second active area formed with the semiconductor substrate, and defined by the isolation area;
a first source electrode formed over the semiconductor substrate within the first active area;
a first drain electrode formed over the semiconductor substrate within the first active area and adjacent the first source electrode, wherein the first source electrode and the first drain electrode are configured to support current flow parallel to a first direction;
a first gate electrode formed over the semiconductor substrate in the first active area and disposed between first source electrode and the first drain electrode, wherein the first gate electrode controls the flow of current from the first source electrode to the first drain electrode in the first direction;
a second source electrode formed over the semiconductor substrate in the second active area and electrically coupled to the first source electrode;
a second drain electrode formed over the semiconductor substrate in the second active area, adjacent the second source electrode, and electrically coupled to the first drain electrode, wherein the second source electrode and the second drain electrode are configured to support current flow parallel to a second direction;
a second gate electrode formed over the semiconductor substrate in the second active area, disposed between the second source electrode and the second drain electrode, and electrically coupled to the first gate electrode, wherein the second gate electrode controls the flow of current from the second source electrode to the second drain electrode in the second direction;
a first crossing region electrically coupled to the first gate electrode; and
a second crossing region electrically coupled to the second drain electrode, wherein the second crossing region crosses a portion of the first crossing region.

17. The semiconductor device of claim 16, wherein the first active area and the second active area are electrically coupled within the semiconductor substrate.

18. The semiconductor device of claim 16, wherein the first active area and the second active area are electrically isolated within the semiconductor substrate.

19. The transistor device of claim 17, further comprising:
a third active area, formed within the semiconductor substrate, adjacent the first active area, and defined by the isolation area;
a fourth active area, formed with the semiconductor substrate, adjacent the second active area, and defined by the isolation area;
a third source electrode formed over the semiconductor substrate, within the third active area, and electrically coupled to the first source electrode;
a third drain electrode formed over the semiconductor substrate, within the third active area, adjacent the third source electrode, wherein the third source electrode and the third drain electrode are configured to support current flow parallel to the first direction;
a third gate electrode formed over the semiconductor substrate in the third active area and disposed between the third source electrode and the third drain electrode, wherein the third gate electrode controls the flow of current from the third source electrode to the third drain electrode parallel to the first direction;
a fourth source electrode formed over the semiconductor substrate, within the fourth active area, electrically coupled to the third source electrode, and electrically coupled to the second source electrode through a third crossing region, wherein the third crossing region crosses the first crossing region;
a fourth drain electrode formed over the semiconductor substrate, within the fourth active area, adjacent the fourth source electrode, electrically coupled to the third drain electrode, and electrically coupled to the second drain electrode through the second crossing region, and wherein the fourth source electrode and the fourth drain electrode are configured to support current flow parallel to a third direction; and
a fourth gate electrode formed over the semiconductor substrate in the fourth active area and disposed between fourth source electrode and the fourth drain electrode, electrically coupled to the third gate electrode, and electrically coupled to the second gate electrode through a fourth crossing region, wherein the fourth crossing region crosses the first crossing region, and wherein the fourth gate electrode controls the flow of current from the fourth source electrode to the fourth drain electrode in the third direction.

\* \* \* \* \*